United States Patent
Fujimoto et al.

(10) Patent No.: US 10,224,472 B2
(45) Date of Patent: Mar. 5, 2019

(54) THERMOELECTRIC POWER MODULE

(71) Applicant: KELK LTD., Kanagawa (JP)

(72) Inventors: Shinichi Fujimoto, Kanagawa (JP); Hiroyuki Matsunami, Kanagawa (JP)

(73) Assignee: KELK LTD., Kanagawa (JP)

( * ) Notice: Subject to any disclaimer, the term of this patent is extended or adjusted under 35 U.S.C. 154(b) by 0 days.

(21) Appl. No.: 14/909,159

(22) PCT Filed: Aug. 25, 2014

(86) PCT No.: PCT/JP2014/072849
§ 371 (c)(1),
(2) Date: Feb. 1, 2016

(87) PCT Pub. No.: WO2015/030220
PCT Pub. Date: Mar. 5, 2015

(65) Prior Publication Data
US 2016/0163944 A1 Jun. 9, 2016

(30) Foreign Application Priority Data
Aug. 30, 2013 (JP) ................................. 2013-180061

(51) Int. Cl.
*H01L 35/16* (2006.01)
*H01L 35/32* (2006.01)
(Continued)

(52) U.S. Cl.
CPC .............. *H01L 35/16* (2013.01); *H01L 35/04* (2013.01); *H01L 35/08* (2013.01); *H01L 35/18* (2013.01); *H01L 35/32* (2013.01)

(58) Field of Classification Search
CPC ......... H01L 35/16; H01L 35/18; H01L 35/32; H01L 35/04
See application file for complete search history.

(56) References Cited

U.S. PATENT DOCUMENTS

| 5,429,680 A * | 7/1995 | Fuschetti | ................ H01L 35/32 136/203 |
| 2006/0210790 A1* | 9/2006 | Horio | ................. B23K 35/0244 428/323 |

(Continued)

FOREIGN PATENT DOCUMENTS

JP S61-193490 8/1986
JP 9-321352 12/1997
(Continued)

OTHER PUBLICATIONS

JP2009231317 (english translation).*
(Continued)

*Primary Examiner* — Jayne L Mershon
(74) *Attorney, Agent, or Firm* — Wenderoth, Lind & Ponack, L.L.P.

(57) ABSTRACT

A thermoelectric power module which can be manufactured without spoiling solderability or joining strength when a thermoelectric element and an electrode are joined to each other by using solder, and in which electric resistance does not largely increase in long time use. The thermoelectric power module includes: a thermoelectric element consisting essentially of a thermoelectric material containing at least two kinds of elements of bismuth, tellurium, antimony, and selenium as principal components; at least one diffusion prevention layer and a solder joint layer disposed in sequence on a surface of the thermoelectric element, the at least one diffusion prevention layer not containing nickel, and the solder joint layer consisting essentially of at least one of nickel, tin, and an alloy or compound containing them as principal components; an electrode; an electrode protection layer disposed at least on one principal surface of the electrode, and including a film containing nickel as a principal component and having a thickness of 0.2 μm to 3.0 μm;

(Continued)

and a solder layer joining the solder joint layer to a partial area of the electrode protection layer.

11 Claims, 6 Drawing Sheets

(51) Int. Cl.
*H01L 35/04* (2006.01)
*H01L 35/18* (2006.01)
*H01L 35/08* (2006.01)

(56) References Cited

U.S. PATENT DOCUMENTS

| 2013/0032188 | A1* | 2/2013 | Kajihara | H01L 35/08 |
| | | | | 136/200 |
| 2014/0216515 | A1* | 8/2014 | Ochi | H01L 35/10 |
| | | | | 136/205 |

FOREIGN PATENT DOCUMENTS

| JP | 2001-028462 | 1/2001 | | |
| JP | 2001-28462 | 1/2001 | | |
| JP | 2001-284621 | 1/2001 | | |
| JP | 2001-102645 | 4/2001 | | |
| JP | 2004-14766 | 1/2004 | | |
| JP | 2005-268555 | 9/2005 | | |
| JP | 2008-10612 | 1/2008 | | |
| JP | 2010-182940 | 8/2010 | | |
| JP | WO2011102498 | * | 8/2011 | H01L 35/00 |
| JP | 2011-171668 | 9/2011 | | |
| JP | WO2013076765 | * | 5/2013 | H01L 35/08 |
| KR | 10-2007-0026407 | 3/2007 | | |
| WO | 2005/075382 | 8/2005 | | |

OTHER PUBLICATIONS

Notification of Reasons for Rejection dated Oct. 4, 2016, in counterpart Japanese Application No. 2013-180061, with English translation.
International Search Report dated Dec. 2, 2014 in corresponding (PCT) Application No. PCT/JP2014/072849.
Notification of Reasons for Rejection dated Jan. 10, 2017 in corresponding Japanese Application No. 2013-180061, with English translation.
Office Action dated Jan. 30, 2018 in Japanese Application No. 2017-074882, with Partial English Translation.
Office Action dated Dec. 23, 2016 in corresponding Korean Application No. 10-2016-7004321, with partial English translation.

* cited by examiner (A)

(B)

(A)            (B)

THERMOELECTRIC POWER MODULE

TECHNICAL FIELD

The present invention relates to a thermoelectric power module using thermoelectric elements and thereby generating electricity by utilizing difference in temperature.

BACKGROUND ART

Conventionally, thermoelectric generation of electricity is known in which the thermoelectric elements are disposed between a heat exchanger at a higher temperature part and another heat exchanger at a lower temperature part to generate electricity. The thermoelectric element is an application of a thermoelectric effect to be called Seebeck effect. In the case where a semiconductor material is used as a thermoelectric material, the thermoelectric power module is configured by electrically connecting a thermoelectric element formed of a P-type semiconductor thermoelectric material and another thermoelectric element formed of an N-type semiconductor thermoelectric material via an electrode.

Such a thermoelectric power module has a simple structure and can be easily treated, and stable characteristics can be retained. Therefore, research work thereof has been widely progressed toward application for the thermoelectric generation of electricity in which electricity is generated by utilizing heat in a gas discharged from an engine of a car, a furnace of a factory, and so on.

Generally, the thermoelectric power module is used in a temperature environment where a difference between a temperature (Th) at a higher temperature part and a temperature (Tc) at a lower temperature part becomes large in order to obtain high thermoelectric conversion efficiency. For example, a thermoelectric power module employing a typical bismuth-tellurium (Bi—Te) based thermoelectric material is used in a temperature environment where a temperature (Th) at the higher temperature part becomes 250° C. to 280° C. at maximum. Accordingly, in the case where nickel plating is applied to an electrode in order to improve solder wettability or the like of the electrode, diffusion of nickel into a solder layer or oxidation of nickel becomes a problem.

As a related art, Japanese patent application publication JP-P2004-14766A (paragraphs 0005-0007) describes a conventional thermoelectric module in which an electroless plating film of a Ni—P or Ni—B base alloy is formed between a thermoelectric element and an electrode in order to prevent diffusion of solder, and a problem that a resistivity of the electroless plating film is high, and when an electric current flows in each thermoelectric element, heat due to the resistance is generated in the plating film and heat is also generated in a heat absorption part, and as a result, performance of the thermoelectric module is lowered than a theoretical value depending on physical properties of a material of the thermoelectric element.

In order to solve this problem, JP-P2004-14766A discloses a thermoelectric module in which thermoelectric elements are connected in series or parallel via upper electrodes and lower electrodes, the thermoelectric element and the upper electrode or the lower electrode are joined to each other by using solder, and an electroless plating film of nickel having a resistivity of 10-60 µΩ·cm is formed on a joint surface of the thermoelectric element.

Japanese patent application publication JP-P2001-102645A (paragraphs 0006-0009) describes that a nickel plating layer having a thickness of 1-5 µm is apt to be formed with pinholes on a surface thereof, and as a result, a solder component diffuses into a thermoelectric semiconductor element through the pinholes. Accordingly, JP-P2001-102645A discloses a thermoelectric element formed with a nickel plating layer having a thickness of 7 µm or larger on a surface thereof in order to prevent diffusion of the solder component while keeping performance of the thermoelectric element.

Japanese patent application publication JP-A-H9-321352 (paragraph 0012 and FIG. 25) discloses a thermoelectric module having a thermoelectric element consisting of an element main body consisting of Bi—Te—Sb—Se, and a Ni layer and a Mo layer provided on a joint plane to be joined to a joining electrode. Further, JP-A-H9-321352 describes it is preferable that the Ni layer has a thickness of 1 µm or larger, and the Mo layer has a thickness of 1 µm or less.

Japanese patent application publication JP-P2008-10612A (paragraphs 0010-0012) discloses a method of manufacturing a thermoelectric element which method is capable of forming a diffusion prevention layer effective for preventing diffusion of elements and having a high peel strength on a thermoelectric material containing at least one of bismuth, tellurium, selenium, and antimony, and discloses a thermoelectric element manufactured by using such a method of manufacturing a thermoelectric element.

The thermoelectric element includes a thermoelectric material containing at least two of bismuth (Bi), tellurium (Te), selenium (Se), and antimony (Sb), a diffusion prevention layer formed on the thermoelectric material and for preventing diffusion of a different kind of element into the thermoelectric material, and a solder joint layer formed on the diffusion prevention layer and for joining the diffusion prevention layer and solder to each other, and is characterized in that a peel strength at an interface between the thermoelectric material layer and the diffusion prevention layer or an interface between the diffusion prevention layer and the solder joint layer is 0.6 MPa or more.

Japanese patent application publication JP-P2011-171668A (paragraphs 0013-0014) discloses a thermoelectric power module capable of bearing long time use in a high temperature environment where a temperature at a higher temperature part exceeds 250° C. The thermoelectric power module includes an thermoelectric power element, a first diffusion prevention layer disposed on a surface of the thermoelectric power element and consisting of molybdenum (Mo), a second diffusion prevention layer disposed on a surface of the first diffusion prevention layer opposite to the thermoelectric power element side and consisting of an intermetallic compound of nickel-tin (Ni—Sn), an electrode, a third diffusion prevention layer disposed on a surface of the electrode and consisting of an intermetallic compound of nickel-tin (Ni—Sn), and a solder layer joining the second diffusion prevention layer and the third diffusion prevention layer to each other and containing lead (Pb) at not less than 85%.

SUMMARY OF INVENTION

Technical Problem

As mentioned above, in the case where a thermoelectric element and an electrode are joined to each other by using solder in a thermoelectric power module, it is general to form a nickel film on at least one of the thermoelectric element and the electrode in order to improve solderability or joining strength. At that time, the nickel film having a certain thickness is formed for the purpose of preventing diffusion of a dissimilar element into the thermoelectric element. For example, in JP-P2001-102645A, a nickel plating layer having a thickness of 7 µm or larger is formed in order to reduce pinholes.

However, it has been discovered as a new finding that in the case where high temperature solder having a high content rate of lead (Pb) is used on the assumption that a thermoelectric power module is used at a high temperature, nickel diffuses into solder to form an oxide. Since electric resistance of the nickel oxide is high, there is a major problem that electric resistance of the thermoelectric power module increases and thermoelectric conversion characteristics of the thermoelectric power module remarkably decrease when a large amount of nickel oxide is produced along a plane parallel to a solder joint plane.

Although there is a certainly possibility that diffusion of a dissimilar element into the thermoelectric element changes thermoelectric conversion characteristics thereof, the influence is not so significant as that of formation of the nickel oxide. Further, it is possible to drastically suppress the diffusion by a diffusion prevention layer formed on the thermoelectric element. On the other hand, increase of electric resistance due to formation of the nickel oxide cannot be solved at all by forming the diffusion prevention layer on the thermoelectric element. Furthermore, from a point of view as disclosed in the prior art that a nickel film is made thick as far as no peeling off of the film occurs due to stress caused by a difference of linear expansion coefficients when combined as a device, the exact opposite effect is brought.

Accordingly, in view of the above-mentioned points, an object of the present invention is to provide a thermoelectric power module which can be manufactured without spoiling solderability or joining strength when a thermoelectric element and an electrode are joined to each other by using solder, and in which electric resistance does not largely increase in long time use.

Solution to Problem

In order to achieve the above-mentioned object, a thermoelectric power module according to one aspect of the present invention includes: a thermoelectric element consisting essentially of a thermoelectric material containing at least two kinds of elements of bismuss (Bi), tellurium (Te), antimony (Sb), and selenium (Se) as principal components; at least one diffusion prevention layer and a solder joint layer disposed in sequence on a surface of the thermoelectric element, the at least one diffusion prevention layer not containing nickel (Ni), and the solder joint layer consisting essentially of at least one of nickel (Ni), tin (Sn), and an alloy or compound containing nickel (Ni) and tin (Sn) as principal components; an electrode; an electrode protection layer disposed at least on one principal surface of the electrode, and including a film containing nickel (Ni) as a principal component and having a thickness of 0.2 µm to 3.0 µm; and a solder layer joining the solder joint layer to a partial area of the electrode protection layer.

Advantageous Effects of Invention

According to one aspect of the present invention, the solder joint layer is disposed on the thermoelectric element via the at least one diffusion prevention layer, and the electrode protection layer is disposed at least on one principal surface of the electrode, and therefore, solderability or joining strength is not spoiled when the thermoelectric element and the electrode are joined to each other by using solder. Further, in the electrode protection layer, since a thickness of the film containing nickel (Ni) as a principal component is thin such as 0.2 µm to 3.0 µm, an amount of nickel which may diffuse into the solder layer is small, and a large amount of nickel oxide cannot be produced in the solder layer even if nickel diffused into the solder layer is oxidized. Accordingly, even in long time use, electric resistance of the thermoelectric power module hardly increases, and initial characteristics of the thermoelectric power module can be preserved.

DESCRIPTION OF EMBODIMENTS

Figure 1:
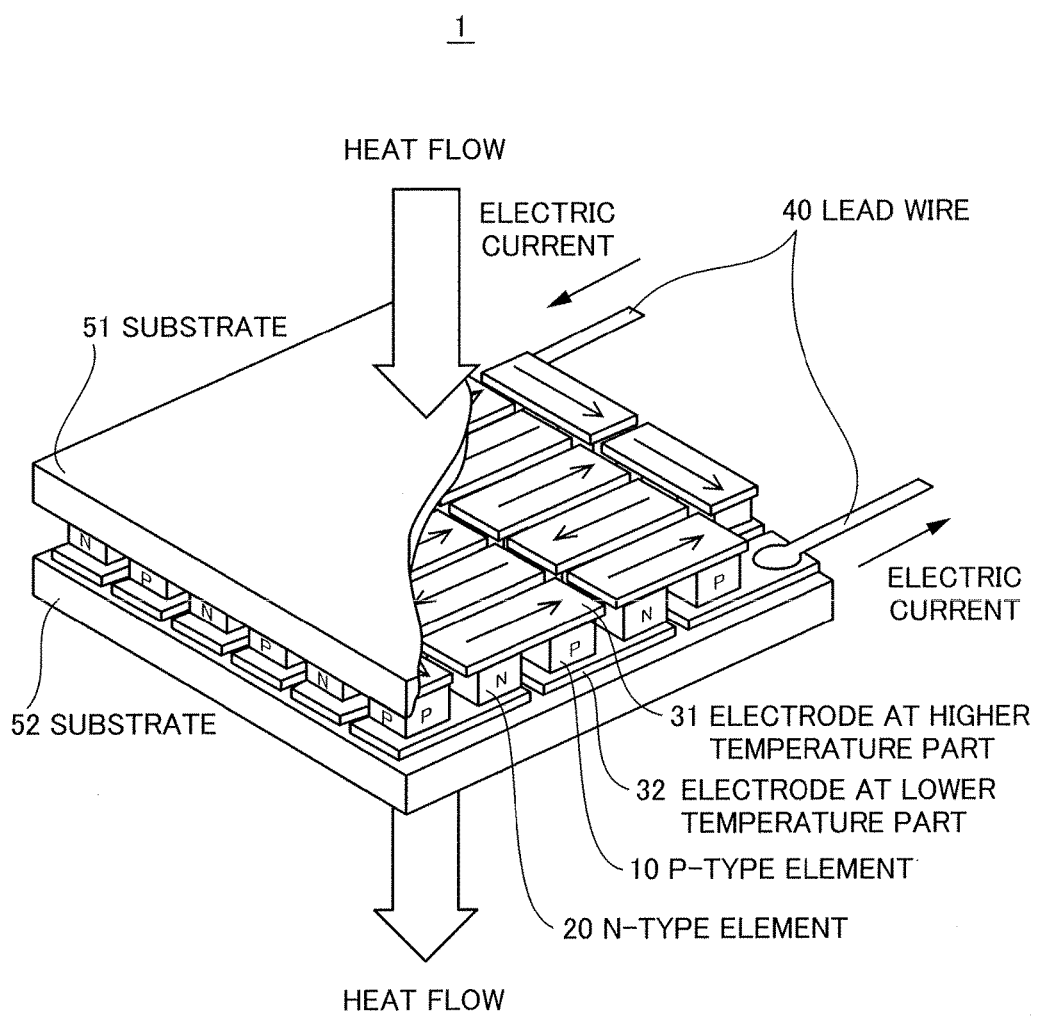
FIG. 1 is a perspective diagram showing an outline of a thermoelectric power module according to an embodiment of the present invention.

Hereinafter, an embodiment of the present invention will be explained in detail by referring to the drawings. The same reference characters are assigned to the same component elements, and overlapping description thereof will be omitted.

FIG. 1 is a perspective diagram showing an outline of a thermoelectric power module according to an embodiment of the present invention. In the thermoelectric power module 1, a thermoelectric element (P-type element) 10 formed of a P-type semiconductor thermoelectric material and a thermoelectric element (N-type element) 20 formed of an N-type semiconductor thermoelectric material are electrically connected via an electrode 31 or 32, and thereby, a PN element pair is configured. Further, plural PN element pairs are connected in series via plural electrodes 31 at a higher temperature part and plural electrodes 32 at a lower temperature part.

Two lead wires 40 are electrically connected via two electrodes 32 at the lower temperature part to the P-type element at one end and the N-type element at the other end of a series circuit composed of the plural PN element pairs, respectively. In FIG. 1, substrates (heat exchange substrates) 51 and 52 formed of an electric insulation material such as ceramics are arranged to hold those PN element pairs therebetween. When supplying heat to the substrate 51 part and cooling the substrate 52 part by coolant or the like, electromotive force is generated in the thermoelectric power module 1. When a load (not shown) is connected between the two lead wires 40, an electric current flows as shown in FIG. 1. That is, by supplying difference in temperature between both parts of the thermoelectric power module 1 (an upper part and a lower part in the drawing), electric power can be extracted.

Here, it is desirable that either one or both of the substrates 51 and 52 are omitted such that either one or both of the electrode 31 at the higher temperature part and the electrode 32 at the lower temperature part may be in directly contact with a surface of heat exchanger having an electrical insulating property. In that case, the thermoelectric conversion efficiency can be improved. The thermoelectric power module, in which either one of the substrates 51 and 52 is omitted, is called half-skeleton structure, and the thermoelectric power module, in which both of the substrates 51 and 52 are omitted, is called full-skeleton structure.

Each of the P-type element 10 and the N-type element 20 is composed of a bismuth-tellurium (Bi—Te) based thermoelectric material containing at least two kinds of elements of bismuth (Bi), tellurium (Te), antimony (Sb), and selenium (Se) as principal components. For example, the P-type element 10 is composed of a thermoelectric material containing bismuth (Bi), tellurium (Te), and antimony (Sb). Further, the N-type element 20 is composed of a thermoelectric material containing bismuth (Bi), tellurium (Te), and selenium (Se). Especially, in a temperature environment where a temperature of a heat exchanger at a higher temperature part becomes 250° C. to 280° C. at maximum, the bismuth-tellurium (Bi—Te) based thermoelectric material is suitable. Further, the electrode 31 at the higher temperature side and the electrode 32 at the lower temperature side are composed of, for example, copper (Cu) having a high electrical conduction property and high thermal conductivity.

Figure 2:
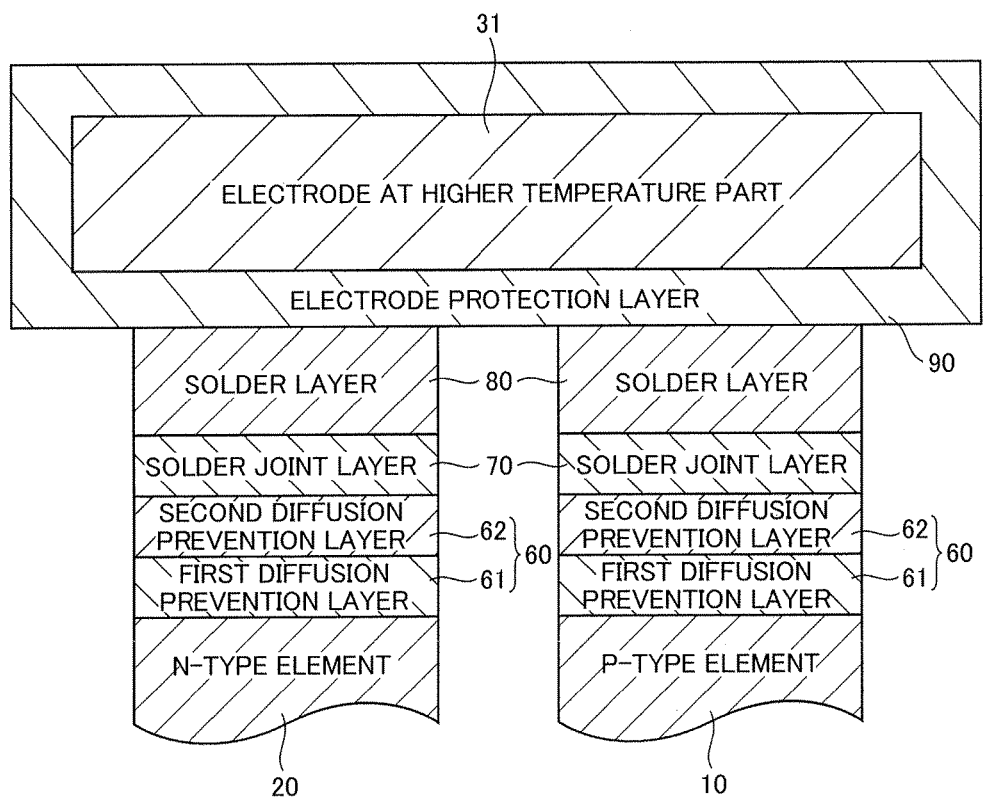
FIG. 2 is a cross section diagram showing a part of a thermoelectric power module according to an embodiment of the present invention.

FIG. 2 is a cross section diagram showing a part of a thermoelectric power module according to an embodiment of the present invention. Although FIG. 2 shows structure of a joint part of the P-type element 10 and the electrode 31 at the higher temperature part and a joint part of the N-type element 20 and the electrode 31 for example, structure of a joint part of the P-type element 10 and the electrode 32 (FIG. 1) at the lower temperature part and a joint part of the N-type element 20 and the electrode 32 may be the same as the structure as shown in FIG. 2. However, a size of each part may be changed suitably.

As shown in FIG. 2, the thermoelectric power module includes a P-type element 10, an N-type element 20, at least one diffusion prevention layer 60, a solder joint layer 70, and a solder layer 80 joined to the solder joint layer 70. The at least one diffusion prevention layer 60 and the solder joint layer 70 are disposed in sequence on a surface (top surface in the drawing) of each of the P-type element 10 and the N-type element 20. Here, as the at least one diffusion prevention layer 60, a first diffusion prevention layer 61 and a second diffusion prevention layer 62 may be provided.

Further, the thermoelectric power module includes an electrode 31 at a higher temperature part, and an electrode protection layer 90 disposed at least on one principal surface (bottom surface in the drawing) of the electrode 31 at the higher temperature part. The electrode protection layer 90 is formed on the electrode 31 at the higher temperature part by plating or the like, and may be formed on not only the one principal surface but also all side surfaces and the other principal surface (top surface in the drawing) of the electrode 31 at the higher temperature part as shown in FIG. 2. The solder layer 80 joins the solder joint layer 70 to a partial area of the electrode protection layer 90.

The first diffusion prevention layer 61 consists of, for example, at least one of molybdenum (Mo) and tungsten (W). The second diffusion prevention layer 62 consists of, for example, at least one of cobalt (Co), titanium (Ti), and an alloy or compound containing them as principal components. Here, the compound is a conception including an intermetallic compound, a nitride, or the like. However, any diffusion prevention layer does not contain nickel (Ni).

A thickness of the first diffusion prevention layer 61 is, for example, 2.7 µm to 13 µm, and a thickness of the second diffusion prevention layer 62 is, for example, 0.5 µm to 7 µm. By providing the first diffusion prevention layer 61 and the second diffusion prevention layer 62, it is possible to suppress diffusion of a material of the solder joint layer 70 into the thermoelectric element or oxidation of the thermoelectric element.

The solder joint layer 70 consists of at least one of nickel (Ni), tin (Sn), and an alloy or compound containing them as principal components such as nickel-tin (Ni—Sn). By providing the solder joint layer 70, the solder wettability can be improved. Here, as a ratio of nickel (Ni) and tin (Sn) in the alloy or compound such as nickel-tin (Ni—Sn), 60 at % Ni-40 at % Sn is suitable.

It is desirable that the solder layer 80 includes solder having a composition containing lead (Pb) and tin (Sn) as principal components, and a ratio thereof is represented by $Pb_xSn_{(1-x)}$ ($x \geq 0.85$). By employing solder having such a composition, it is possible to provide a thermoelectric power module capable of bearing use at a high temperature. Further, since content of tin (Sn) is low, reaction or alloying of the solder joint layer 70 or the diffusion prevention layer 60 and tin (Sn) is suppressed, and peeling off of each layer can be prevented. In addition, a content rate of tin (Sn) may be extremely near zero ($x<1$).

In the case where solder in the solder layer 80 contains lead (Pb) at 85% or more, a melting point of solder becomes 260° C. or higher, and thereby, solder does not melt at a high temperature of 260° C. and can favorably join the thermoelectric element to the electrode. Further, in the case where a content rate of lead is 90% or more, a melting point of solder becomes 275° C. or higher. In the case where a content rate of lead is 95% or more, a melting point of solder becomes 305° C. or higher. In the case where a content rate of lead is 98% or more, a melting point of solder becomes 317° C. or higher.

The solder layer 80 may further include particles mixed into solder. As the particles, for example, copper (Cu) balls can be employed. In the case where copper is employed as a material of the particles, the particles do not melt and disappear at a high temperature of 260° C. to 317° C., and since the electric resistance is low, an electric current can efficiently flow between the thermoelectric element and the electrode. Further, gold (Au) may be coated on surfaces of the copper balls.

By mixing the copper balls into the solder layer 80 in the joint layer for joining the thermoelectric element to the electrode, the copper balls function as clearance retaining members. Accordingly, even in the case where many thermoelectric elements and electrodes are joined to one another simultaneously, heights of the thermoelectric power module become uniform, and sufficient joining strength can be ensured. Also, in solder joining under the condition where pressure acts or in use under a high temperature environment, a thickness of the solder layer 80 is kept by the copper balls. Accordingly, solder can be prevented from jutting out, and it is possible to prevent destruction or the like due to reaction of jutting out solder and a thermoelectric material. As a thickness of the solder layer 80, a thickness of substantially 50 μm to substantially 150 μm is suitable.

The electrode protection layer 90 is provided mainly for a purpose of preventing oxidation or improving solder wettability of the electrode 31 at the higher temperature part, and includes a film containing nickel (Ni) as a principal component. For example, the electrode protection layer 90 may be composed of a nickel (Ni) plating film disposed at least on one principal surface of the electrode 31 at the higher temperature part, or may be composed of layered structure of such a nickel (Ni) plating film and a gold (Au) plating film. However, since a thickness of the gold plating film is about 0.2 μm and gold easily diffuses into the solder layer 80, there is a high possibility that the gold plating film cannot be observed after solder jointing. Further, the nickel (Ni) plating film may contain phosphorus (P) of about 4% to 10%.

Thus, the electrode protection layer 90 includes the film containing nickel (Ni) as a principal component. Accordingly, in the case where high temperature solder having a high content rate of lead (Pb) is used, nickel diffuses into solder and diffused nickel is oxidized to form nickel oxide. Since electric resistance of the nickel oxide is high, electric resistance of the whole thermoelectric power module remarkably increases and thermoelectric conversion characteristics of the thermoelectric power module remarkably decrease when a large amount of nickel oxide is produced along a plane parallel to a solder joint plane.

Figure 3:
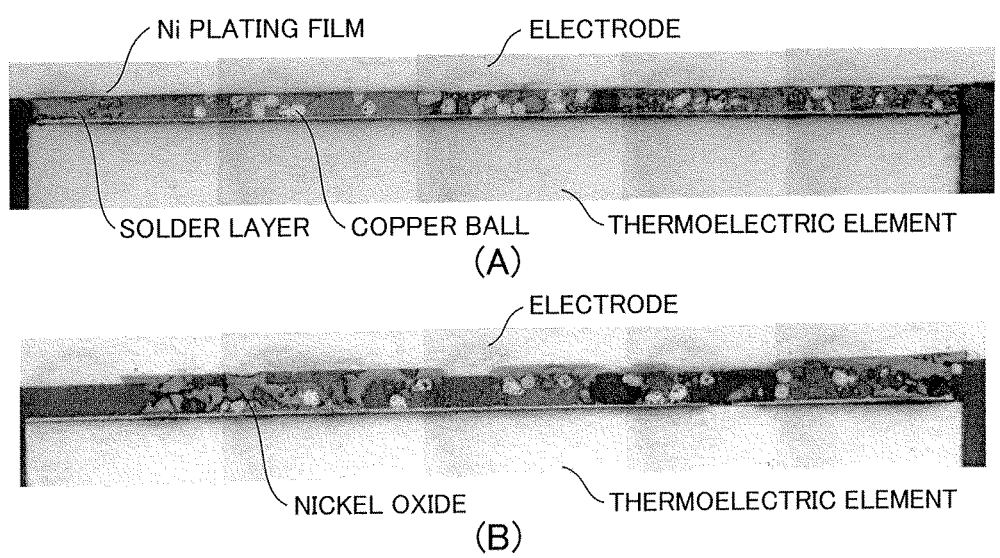
FIG. 3 shows photomicrographs of a cross section of a thermoelectric power module before and after an endurance test, in which a nickel plating film having a thickness of 20 µm is formed as the electrode protection layer.

FIG. 3 shows photomicrographs of a cross section of a thermoelectric power module before and after an endurance test, in which a nickel plating film having a thickness of 20 μm is formed as the electrode protection layer. FIG. 3(A) shows the cross section before the endurance test, and FIG. 3(B) shows the cross section after the endurance test. This endurance test was performed by setting a temperature at a higher temperature part to 280° C., setting a temperature at a lower temperature part to 30° C., and keeping the temperatures of the thermoelectric power module in the air for 3760 hours.

Before the endurance test, as shown in FIG. 3(A), a solder layer including copper balls is joined to an electrode formed with a nickel (Ni) plating film as the electrode protection layer. On the other hand, after the endurance test, as shown in FIG. 3(B), nickel (Ni) in the electrode protection layer diffuses into the solder layer, and diffused nickel (Ni) is oxidized to form nickel oxide. As a result, in a portion of the thermoelectric power module as shown in FIG. 3(B), electric resistance thereof increases by about 13%.

Accordingly, the inventors of the present application have focused on limiting a thickness of the film, which is included in the electrode protection layer and contains nickel (Ni) as a principal component, within a suitable range in order to suppress the increase of electric resistance. On that account, the inventors of the present application prepared eight kinds of samples in which thicknesses of the nickel film formed on the electrode are different from one another in the thermoelectric power module as shown in FIGS. 1 and 2, and performed an endurance test for those samples.

In this endurance test, measurement of electric resistance and observation of cross-sections after the endurance test were performed. In a main body of the thermoelectric power module provided for the endurance test, as shown in FIG. 1, the electrode 31 at the higher temperature part and the electrode 32 at the lower temperature part are arranged alternately, and the P-type element 10 and the N-type element 20 are arranged alternately between the upper and lower electrodes. Thereby, plural P-type elements 10 and plural N-type elements 20 are electrically connected in series via plural electrodes 31 at the higher temperature part and plural electrodes 32 at the lower temperature part. By connecting two lead wires 40 to two electrodes 32 at the lower temperature part arranged at both ends of the series circuit, respectively, electric power generated by the plural P-type elements 10 and the plural N-type elements 20 can be added and extracted.

Sides of the main body of the thermoelectric power module are surrounded by a frame made of resin (not shown). Substrates 51 and 52 having an electric insulation property are attached to an upper surface and a lower surface of the main body of the thermoelectric power module via grease having thermal conductivity, respectively. Each of the substrates 51 and 52 has a size which covers the electrodes and the flame such that the flame is not directly contact with a heat source when the thermoelectric power module is attached to the heat source.

The P-type element 10 is a fine crystal of a rhombohedral structural material containing bismuth (Bi), tellurium (Te), and antimony (Sb) as principal components. The N-type element 20 is a fine crystal of a rhombohedral structural material containing bismuth (Bi), tellurium (Te), and selenium (Se) as principal components. As to a method of forming multilayer films on the P-type element 10 and the N-type element 20, film formation was performed according to an ion plating method on the following condition. An alternating plasma output was set to 450 W, an atmosphere is argon (Ar), an electron beam was used as means for vaporizing a material, and a current of the electron beam was set to 0.3 A to 0.4 A.

As the first diffusion prevention layer 61, a molybdenum (Mo) film having a thickness of 7 μm is provided, and as the second diffusion prevention layer 62, a cobalt (Co) film having a thickness of 1.4 μm is provided. Further, as the solder joint layer 70, a nickel-tin (Ni—Sn) alloy film having a thickness of 0.9 μm is provided.

The solder layer 80 is formed by mixing copper (Cu) balls of 7.5 wt % into cream solder having a composition of $Pb_{98}Sn_2$. The electrode 31 at the higher temperature side and the electrode 32 at the lower temperature side are made of pure copper. As the electrode protection layer 90, a nickel (Ni) plating film having a thickness of 0 μm to 20 μm is formed according to the samples, and further, a gold (Au) plating film having a thickness of 0.2 μm is formed. The flame is made of PEEK (polyether ether ketone) resin, and the substrates 51 and 52 are made of 96% alumina.

<Measurement of Electric Resistance>

The maximum output power "P" of a thermoelectric power module is represented by the following expression (1).

$$P=V^2/4R \qquad (1)$$

Here, "V" represents an output voltage of the thermoelectric power module with no load, and "R" represents electric resistance (internal resistance) of the thermoelectric power module. In the case where a load connected to the thermoelectric power module has electric resistance equal to the internal resistance of the thermoelectric power module, the maximum power can be extracted from the thermoelectric power module. As understood from the expression (1), the maximum output power "P" decreases inversely proportionally with the electric resistance "R" of the thermoelectric power module. Accordingly, by investigating a change in the electric resistance of the thermoelectric power module, it is possible to know condition of deterioration of the thermoelectric power module.

Figure 4:
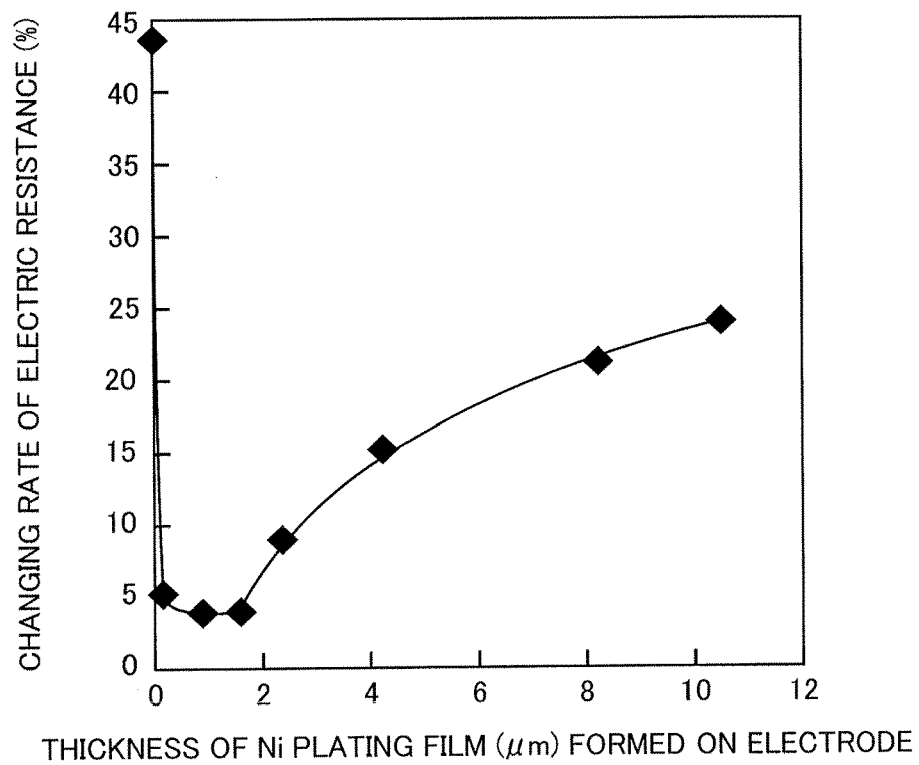
FIG. 4 is a diagram showing a result of measuring changing rates of electric resistance of thermoelectric power modules after an endurance test.

As test condition 1, a temperature of the whole thermoelectric power module was set to 280° C., and an atmosphere is the air. Then, an endurance test was performed for a heating time of 800 hours with respect to plural samples having different thicknesses of the nickel plating film formed on the electrode. FIG. 4 is a diagram showing a result of measuring changing rates of electric resistance of thermoelectric power modules after the endurance test. In FIG. 4, the horizontal axis represents a thickness (μm) of the nickel (Ni) plating film formed on the electrode, and the vertical axis represents a changing rate of electric resistance (%) to an initial value thereof.

In the sample with no nickel (Ni) plating film but only the gold (Au) plating film (a thickness of the Ni plating film is 0 μm), solder is not favorably joined to the electrode, and the electrode itself has been oxidized after the endurance test. As a result, a changing rate of the electric resistance after the endurance test becomes high, and it is understood that it is difficult to simply omit nickel for the purpose of suppressing diffusion and oxidation of nickel.

Referring to FIG. 4, the changing rate of the electric resistance is minimized in a range where a thickness of the nickel plating film is 0.2 μm to 3 μm, especially, about 1 μm. One purpose of the nickel plating is to ensure solder wettability of the electrode. If the nickel film is too thin or does not exist, solder wettability of the electrode is impaired. Accordingly, it is necessary that the nickel film has a thickness of at least 0.2 μm in order to ensure solder wettability of the electrode.

Further, solder processing is not conducted for a portion of the electrode, and the portion of the electrode is exposed to outside air only via the nickel plating layer (and the gold plating layer depending on the situation). Accordingly, it is desirable that the nickel film has a thickness of preferably 0.9 μm or larger in order to prevent corrosion of the electrode in a working condition of the thermoelectric power module. In addition, since a standard deviation "σ" of a thickness of the nickel film is 0.11 μm, considering ability of a nickel plating process, it is desirable that the nickel film has a thickness of more preferably 1.2 μm (0.9 μm+0.3 μm=1.2 μm) or larger in order to ensure a thickness of 0.9 μm certainly.

On the other hand, from FIG. 4, it is necessary that the nickel film has a thickness of 3.0 μm or less so that a decline in output power of the thermoelectric power module is within 10%. Further, it is desirable that the nickel film has a thickness of preferably 2.1 μm or less so that a decline in output power of the thermoelectric power module is within 7.5%. Alternatively, it is desirable that the nickel film has a thickness of more preferably 1.6 μm or less so that a decline in output power of the thermoelectric power module is within 5%.

From the above, by limiting a thickness of the nickel (Ni) film formed on the electrode within at least a range from 0.2 μm to 3.0 μm, preferably a range from 0.9 μm to 2.1 μm, more preferably a range from 1.2 μm to 1.6 μm, it is possible to manufacture a thermoelectric power module without spoiling solderability or joining strength when a thermoelectric element and an electrode are joined to each other by using solder, and to use the thermoelectric power module without large increase of electric resistance in a long time.

Figure 5:
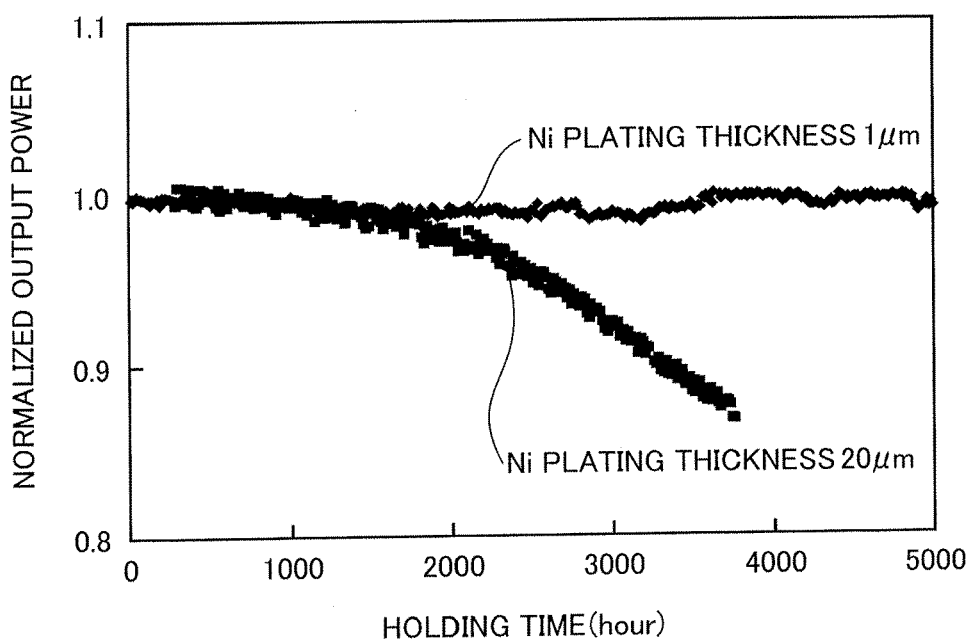
FIG. 5 is a diagram showing a result of measuring output power of thermoelectric power modules in an endurance test.

As test condition 2, a temperature at a higher temperature part of the thermoelectric power module was set to 280° C., a temperature at a lower temperature part of the thermoelectric power module was set to 30° C., and an atmosphere is the air. Then, an endurance test was performed while keeping the temperature at the higher temperature part and the temperature at the lower temperature part of the thermoelectric power module with respect to plural samples having different thicknesses of the nickel plating film formed on the electrode. FIG. 5 is a diagram showing a result of measuring output power of thermoelectric power modules in the endurance test. In FIG. 5, the horizontal axis represents a holding time (hour), and the vertical axis represents normalized output power in which an initial value thereof is normalized as "1".

As shown in FIG. 5, in the thermoelectric power module in which a thickness of the nickel plating film formed on the electrode is 20 μm, the output power decreases by about 10% when the holding time is 3000 hours. On the other hand, in the thermoelectric power module in which a thickness of the nickel plating film formed on the electrode is 0.9 μm, a decline in the output power is not generally observed even when the holding time exceeds 5000 hours.

<Observation of Cross-Sections after Endurance Test>

Figure 6:
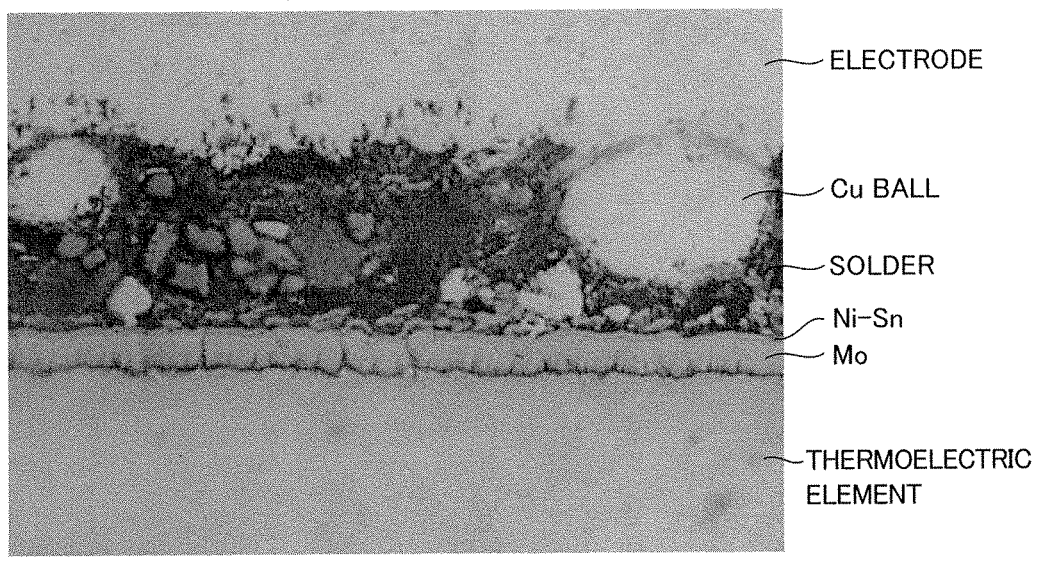
FIG. 6 shows a difference of cross sections of thermoelectric power modules after an endurance test according to a difference of thicknesses of a nickel film in the electrode protection layer.
Figure 6:
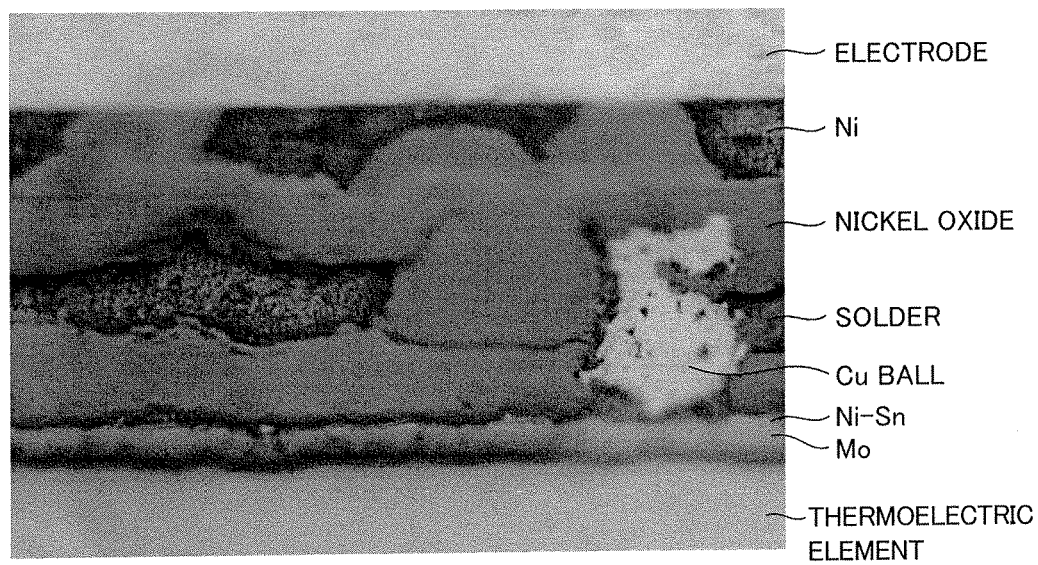

Cross sections of thermoelectric power modules were observed with respect to the samples for which the endurance test was performed under the test condition 2. FIG. 6 shows a difference of the cross sections of the thermoelectric power modules after the endurance test according to a difference of thicknesses of the nickel film in the electrode protection layer.

FIG. 6(A) shows a photomicrograph of a cross section when 5000 hours have elapsed from a start of the endurance test of the thermoelectric power module in which a nickel plating film having a thickness of 0.9 μm is formed on the electrode. As shown in FIG. 6(A), in the thermoelectric power module in which a nickel plating film having a thickness of 0.9 μm is formed on the electrode, although nickel oxide is produced in the solder layer, an amount of formation of nickel oxide is restricted and does not lead to increasing electric resistance. Further, almost all the nickel plating film formed in order to improve solder wettability of the electrode at the time of solder joint has diffused after the endurance test. As a result, copper of the electrode and solder becomes indirectly contact with each other. However, the conjugation does not break.

FIG. 6(B) shows a photomicrograph of a cross section when 3760 hours have elapsed from a start of the endurance test of the thermoelectric power module in which a nickel plating film having a thickness of 20 μm is formed on the electrode. As shown in FIG. 6(B), in the thermoelectric power module in which a nickel plating film having a thickness of 20 μm is formed on the electrode, nickel oxide is produced in a layered form in the solder layer and causes a remarkable increase of electric resistance.

In the above-mentioned thermoelectric power modules provided for the endurance test, the solder joint layer is composed of a nickel-tin (Ni—Sn) alloy. Accordingly, the result of the endurance test is affected by influence of nickel (Ni) in the nickel-tin (Ni—Sn) alloy composing the solder joint layer. However, the influence is small in such a degree that can be ignored. Hereinafter, the reason will be explained.

By heating the nickel-tin (Ni—Sn) alloy, intermetallic compounds such as $Ni_3Sn$, $Ni_3Sn_2$, and $Ni_3Sn_4$ are produced. Enthalpies of formation thereof are −24.9 kJ/mol, −34.6 kJ/mol, and −24.0 kJ/mol, respectively. When the thermoelectric power module is used at a high temperature, most of the nickel-tin (Ni—Sn) alloy becomes mixed phase of the above-mentioned intermetallic compounds in an early stage when a diffusion amount of nickel (Ni) and tin (Sn) in the nickel-tin (Ni—Sn) alloy is little.

After the intermetallic compounds have been produced, energy is required when the intermetallic compound of nickel-tin (Ni—Sn) included in the solder joint layer is decomposed into nickel (Ni) and tin (Sn), and more energy is required for nickel included in the intermetallic compound to diffuse into solder than that required for nickel simple substance to diffuse into solder. Accordingly, in the case where the solder joint layer is composed of the nickel-tin alloy instead of nickel, even if the thermoelectric power module is left in a high temperature environment for a long time, diffusion of nickel from the solder joint layer into the solder layer can be suppressed.

According to H. B. Huntington, C. K. Hu, and S. Mei, "Diffusion in Solids: Recent Developments", 1985, pp. 97-119 (Hereinafter, referred to as "Huntington et al."), a diffusion coefficient "D" of nickel (Ni) in lead (Pb) is expressed by the following expression (2).

$$D = D_0 \cdot \exp(-Q_0/kT) \qquad (2)$$

Here, $D_0 = (1.1 \pm 0.05) \times 10^{-2}$ cm$^2$/sec, and $Q_0 = 0.47 \pm 0.02$ eV.

Assuming that nickel (Ni) cannot diffuse before the intermetallic compound of nickel-tin (Ni—Sn) included in the solder joint layer is decomposed into nickel (Ni) and tin (Sn), firstly, energies of 24.9 kJ, 34.6 kJ, and 24.0 kJ are required to decompose one mole of $Ni_3Sn$, $Ni_3Sn_2$, and $Ni_3Sn_4$, respectively. At this time, three moles of nickel (Ni) are produced from each of the intermetallic compounds. That is, energies of 8.3 kJ, 11.5 kJ, and 8.0 kJ are required to produce one mole of nickel (Ni) from the intermetallic compounds, respectively.

Figure 7:
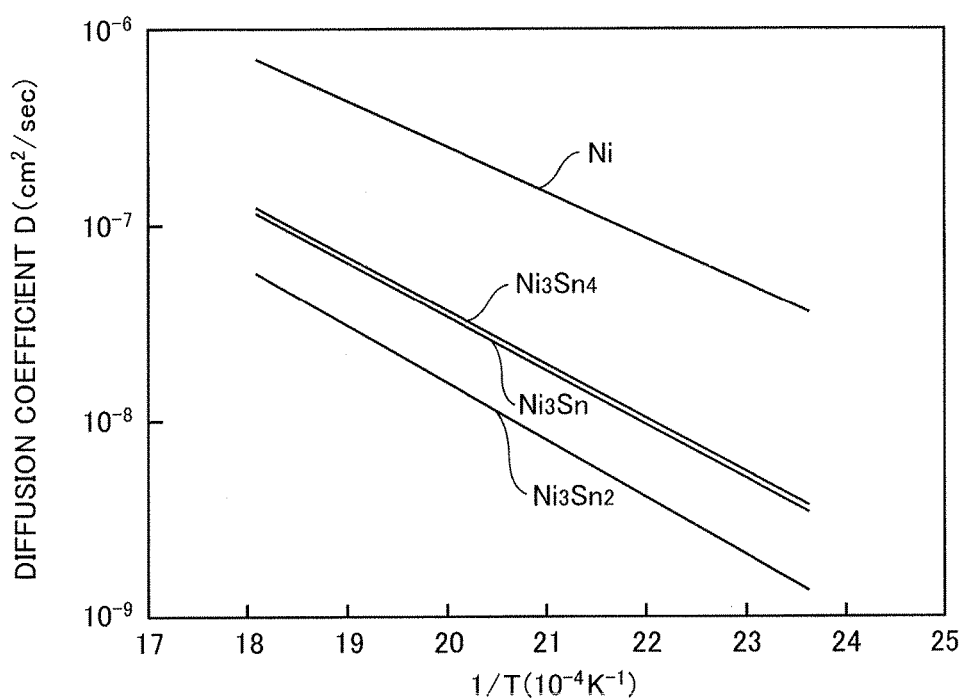
FIG. 7 is a diagram showing a change of a diffusion coefficient "D" according to a temperature in the case where nickel simple substance diffuses into lead and in the case where nickel included in a intermetallic compound of nickel-tin diffuses into lead.

FIG. 7 is a diagram showing a change of the diffusion coefficient "D" according to a temperature in the case where nickel simple substance diffuses into lead and in the case where nickel included in the intermetallic compound of nickel-tin diffuses into lead. In FIG. 7, the horizontal axis represents a reciprocal of the absolute temperature ($10^{-4}$K$^{-1}$), and the vertical axis represents the diffusion coefficient "D" (cm$^2$/sec). The diffusion coefficient in the case where nickel (Ni) simple substance diffuses into lead (Pb) has been calculated based on Huntington et al. The diffusion coefficient in the case where nickel (Ni) included in the intermetallic compound of nickel-tin ($Ni_3Sn$, $Ni_3Sn_2$, or $Ni_3Sn_4$) diffuses into lead (Pb) has been calculated by additionally considering the energy required for the intermetallic compound to be decomposed.

Figure 8:
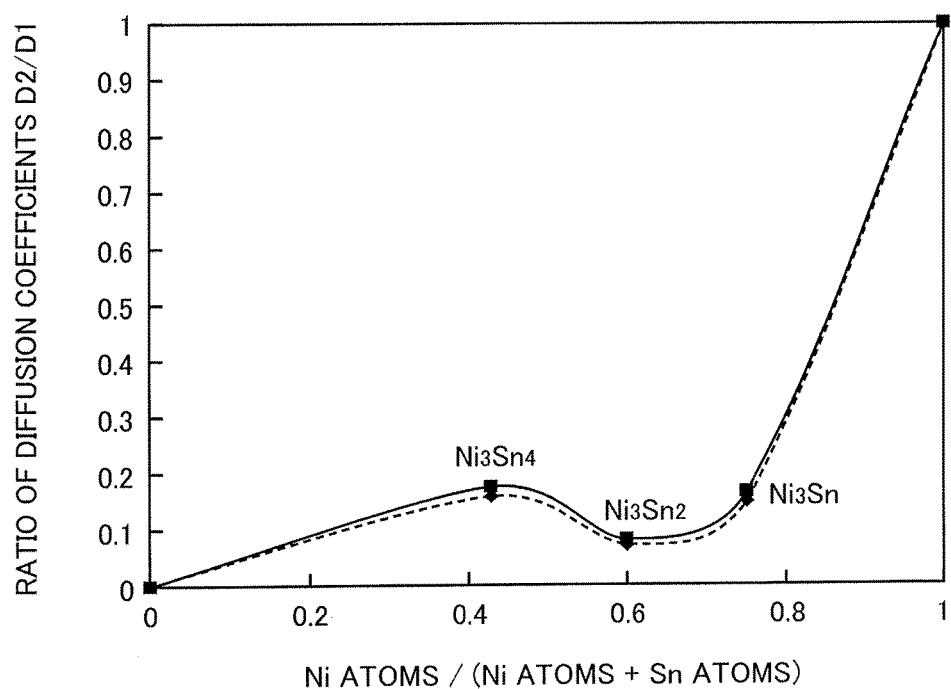
FIG. 8 is a diagram showing a ratio D2/D1 of a diffusion coefficient D2 in the case where nickel included in a intermetallic compound of nickel-tin diffuses into lead to a diffusion coefficient D1 in the case where nickel simple substance diffuses into lead, according to the composition.

FIG. 8 is a diagram showing a ratio D2/D1 of a diffusion coefficient D2 in the case where nickel included in the intermetallic compound of nickel-tin diffuses into lead to a diffusion coefficient D1 in the case where nickel simple substance diffuses into lead, according to the composition.

In FIG. 8, the horizontal axis represents a ratio of a number of atoms of nickel (Ni) in the intermetallic compound of nickel-tin (Ni—Sn), and the vertical axis represents a ratio D2/D1 of the diffusion coefficient D2, in the case where nickel included in the intermetallic compound of nickel-tin diffuses into lead, to the diffusion coefficient D1 in the case where nickel simple substance diffuses into lead. Further, the solid line represents the ratio D2/D1 at 280° C., and the broken line represents the ratio D2/D1 at 250° C.

From the results as shown in FIGS. 7 and 8, in the case where the intermetallic compound of nickel-tin ($Ni_3Sn$, $Ni_3Sn_2$, or $Ni_3Sn_4$) is decomposed and then nickel diffuses into lead, for example, at the supposed maximum working temperature of 280° C., the diffusion coefficient becomes about 18% or less in comparison to that in the case where nickel simple substance diffuses into lead. Assuming that 60 at % Ni-40 at % Sn alloy is employed in the solder joint layer in the present embodiment, in the case where the alloy is decomposed and then nickel diffuses into lead, the diffusion coefficient becomes about 8% in comparison to that in the case where nickel simple substance diffuses into lead. Assuming that a thickness of the solder joint layer is 0.9 μm, a thickness of the 60 at % Ni-40 at % Sn alloy corresponds, when converted into a film thickness of nickel simple substance, to a thickness of 0.07 μm (0.9 μm×0.08=0.07 μm) of a nickel film. Accordingly, the influence is small in such a degree that can be ignored.

Figure 9:
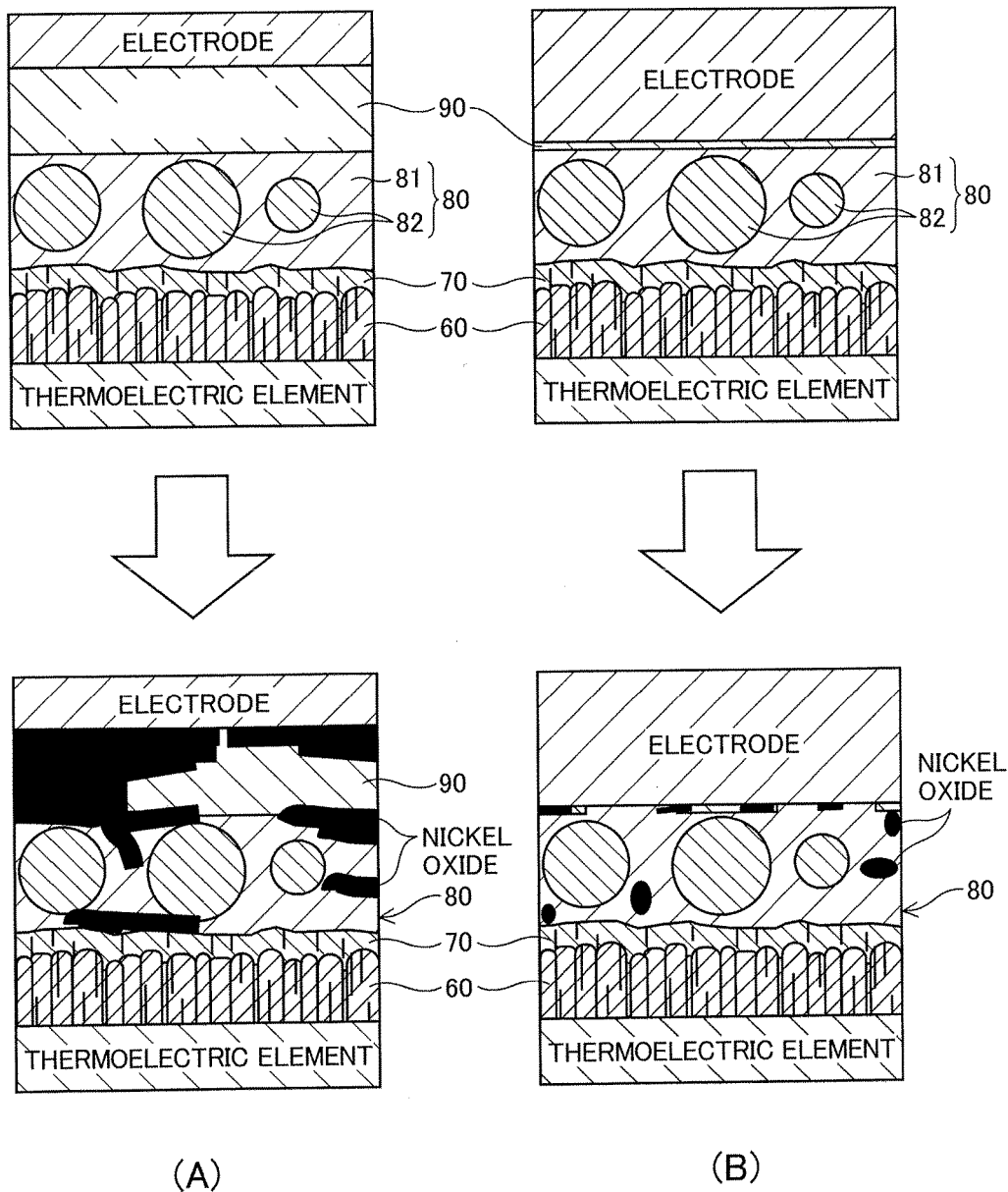
FIG. 9 shows cross section diagrams for explanation of a difference of time-dependent changes of thermoelectric power modules according to a difference of thicknesses of a nickel film in the electrode protection layer.

FIG. 9 shows cross section diagrams for explanation of a difference of time-dependent changes of thermoelectric power modules according to a difference of thicknesses of a nickel film in the electrode protection layer. FIG. 9(A) shows a change of a cross section of a thermoelectric power module due to long time use in the case where a nickel film in the electrode protection layer 90 is thick (for example, 20 μm).

As shown in FIG. 9(A), in the case where the nickel film in the electrode protection layer 90 is thick, while the thermoelectric power module is used for a long time, a large amount of nickel diffuses into the solder layer 80 and diffused nickel is oxidized to form nickel oxide, and thereby, nickel oxide is produced in a layered form in the solder layer 80. Since electric resistance of nickel oxide is high, electric resistance of the whole thermoelectric power module greatly increases and thermoelectric conversion characteristics of the thermoelectric power module remarkably decrease when a large amount of nickel oxide is produced along a plane parallel to a solder joint plane.

FIG. 9(B) shows a change of a cross section of a thermoelectric power module due to long time use in the case where a nickel film in the electrode protection layer 90 is thin (for example, 0.9 μm). As shown in FIG. 9(B), in the case where a nickel film in the electrode protection layer 90 is thin, a large amount of nickel oxide cannot be produced even if a little amount of nickel diffuses into the solder layer 80. Accordingly, electric resistance of the thermoelectric power module hardly increases and initial characteristics of the thermoelectric power module can be preserved.

In FIG. 9, the solder layer 80 includes a solder substrate 81 and particles 82. As the particles 82, copper (Cu) balls can be employed. A diameter of the copper ball is suitably 5 μm to 100 μm. In the case where the diameter of the copper ball is less than 5 μm, when pressure is applied to the thermoelectric power module under a high temperature environment of 200° C. or higher, a thickness of the solder layer 80 becomes less than 5 μm, which is too thin and causes junction defect. On the other hand, in the case where the diameter of the copper ball is larger than 100 μm, a thickness of the solder layer 80 becomes thick, which increases electric resistance of the interface and causes remarkable power loss.

Incidentally, in the case where the thermoelectric power module having the full-skeleton structure is adhered closely to the heat exchangers by using grease having thermal conductivity, thermal resistance becomes high when the pressure applied perpendicularly between the thermoelectric power module and the heat exchangers is less than 196 kN/m² (2 kgf/cm²), and therefore, it is desirable that they are used while applying pressure of 196 kN/m² (2 kgf/cm²) or more perpendicularly.

Since a weight ratio of the copper balls which can bear the pressure of 196 kN/m² (2 kgf/cm²) is required to be 0.75 wt % or more, the lower limit of the weight ratio of the copper balls is 0.75 wt %. If the weight ratio of the copper balls is less than 0.75 wt %, the load affecting the copper balls becomes large, and the copper balls may be crushed or cracks may occur in the thermoelectric element from the copper balls as starting points.

Further, when the pressure applied perpendicularly between the thermoelectric power module and the heat exchangers is 1960 kN/m² (20 kgf/cm²), in the case where the weight ratio of the copper balls is 7.5 wt %, the thermoelectric element does not change the shape, and therefore, the weight ratio of the copper balls is more desirably 7.5 wt % or more.

On the other hand, a success rate of soldered joints with regards to the weight ratio of the copper balls is measured. In the case where the weight ratio of the copper balls is 50 wt %, the success rate is about 100%, and in the case where the weight ratio of the copper balls is 75 wt %, the success rate is about 93%. Accordingly, it is desirable that the copper balls are mixed into the solder substrate 81 such that the weight ratio of the copper balls is 0.75 wt % to 75 wt %, more preferably 7.5 wt % to 50 wt %.

The present invention is not limited to the above-explained embodiment but many modifications are possible within the technical idea of the present invention by one of ordinary skill in the art.

INDUSTRIAL APPLICABILITY

The present invention can be applied to a thermoelectric power module using thermoelectric elements and thereby generating electricity by utilizing difference in temperature.

The invention claimed is:

1. A thermoelectric power module comprising:
a thermoelectric element consisting essentially of a thermoelectric material containing at least two kinds of elements of bismuth (Bi), tellurium (Te), antimony (Sb), and selenium (Se) as principal components;
a first diffusion prevention layer, a second diffusion prevention layer, and a solder joint layer deposited in sequence on a surface of said thermoelectric element, said first and second diffusion prevention layers not containing nickel (Ni), and said solder joint layer consisting essentially of at least one of nickel (Ni), tin (Sn), and an alloy or compound containing nickel (Ni) and tin (Sn) as principal components;
an electrode;
an electrode protection layer configured of a film consisting essentially of nickel (Ni) and directly deposited at least on one principal surface of said electrode and having a thickness of 0.2 μm to 3.0 μm, or layered structure of said film and a gold (Au) film; and
a solder layer which is in direct contact with said solder joint layer and said electrode protection layer, and joins said solder joint layer to a partial area of said electrode protection layer,
wherein said electrode protection layer includes a first portion, on which said solder layer is deposited, for improving solder wettability of said electrode, and a second portion, on which said solder layer is not deposited, for preventing oxidation of said electrode.

2. The thermoelectric power module according to claim 1, wherein said film contains phosphorus (P).

3. The thermoelectric power module according to claim 2, wherein said solder layer includes solder having a composition containing lead (Pb) and tin (Sn) as principal components, a ratio thereof being represented by $Pb_xSn_{(1-x)}$ (x≥0.85), and copper balls mixed into said solder.

4. The thermoelectric power module according to claim 3, wherein said electrode contains copper (Cu).

5. The thermoelectric power module according to claim 2, wherein said electrode contains copper (Cu).

6. The thermoelectric power module according to claim 1, wherein said solder layer includes solder having a composition containing lead (Pb) and tin (Sn) as principal components, a ratio thereof being represented by $Pb_xSn_{(1-x)}$ (x≥0.85), and copper balls mixed into said solder.

7. The thermoelectric power module according to claim 6, wherein said electrode contains copper (Cu).

8. The thermoelectric power module according to claim 1, wherein said electrode contains copper (Cu).

9. The thermoelectric power module according to claim 1, wherein said solder joint layer includes the alloy or compound containing nickel (Ni) and tin (Sn) as principal components.

10. The thermoelectric power module according to claim 9, wherein said solder layer includes solder having a composition containing lead (Pb) and tin (Sn) as principal components, a ratio thereof being represented by $Pb_xSn_{(1-x)}$ (x≥0.85), and copper balls mixed into said solder.

11. The thermoelectric power module according to claim 9, wherein said electrode contains copper (Cu).

* * * * *